United States Patent
Lim et al.

(10) Patent No.: US 6,265,302 B1
(45) Date of Patent: Jul. 24, 2001

(54) PARTIALLY RECESSED SHALLOW TRENCH ISOLATION METHOD FOR FABRICATING BORDERLESS CONTACTS

(75) Inventors: Chong Wee Lim, Johor Bahru (MY); Eng Hua Lim, Singapore (SG); Soh Yun Siah, Singapore (SG); Kong Hean Lee, Singapore (SG); Chun Hui Low, Johor (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/351,238

(22) Filed: Jul. 12, 1999

(51) Int. Cl.[7] ............... H01L 21/4763; H01L 21/76; H01L 21/302
(52) U.S. Cl. ............... 438/622; 438/427; 438/428; 438/431; 438/238; 438/719
(58) Field of Search ............... 438/622, 424–433, 438/404, 238, 719, 700, 723, 724, 743–744

(56) References Cited

U.S. PATENT DOCUMENTS

| | | | |
|---|---|---|---|
| 4,666,556 | * 5/1987 | Fulton et al. | 438/431 |
| 4,899,060 | 2/1990 | Lischke | 250/505.1 |
| 4,982,099 | 1/1991 | Lischke | 250/492.2 |
| 5,268,330 | 12/1993 | Givens et al. | 437/195 |
| 5,557,110 | 9/1996 | Itoh | 250/492.23 |
| 5,652,176 | 7/1997 | Maniar et al. | 437/67 |
| 5,677,231 | 10/1997 | Maniar et al. | 437/67 |
| 5,728,621 | * 3/1998 | Zheng et al. | 438/427 |
| 5,804,490 | 9/1998 | Fiegl et al. | 438/424 |
| 5,807,784 | 9/1998 | Kim | 438/423 |
| 5,817,568 | 10/1998 | Chao | 438/427 |
| 5,937,292 | * 8/1999 | Hammerl et al. | 438/238 |
| 5,937,308 | * 8/1999 | Gardner et al. | 438/424 |
| 6,069,091 | * 5/2000 | Chang et al. | 438/719 |

* cited by examiner

Primary Examiner—Matthew Smith
Assistant Examiner—Igwe U. Anya
(74) Attorney, Agent, or Firm—George O. Saile; Rosemary L. S. Pike; Douglas R. Schnabel

(57) ABSTRACT

An improved and new process for fabricating MOSFET's in shallow trench isolation (STI), with sub-quarter micron ground rules, includes a passivating trench liner of silicon nitride. The silicon nitride passivating liner is utilized in the formation of borderless or "unframed" electrical contacts, without reducing the poly to poly spacing. Borderless contacts are formed, wherein contact openings are etched in an interlevel dielectric (ILD) layer over both an active region (P-N junction) and an inactive trench isolation region. During the contact hole opening, a selective etch process is utilized which etches the ILD layer, while the protecting passivating silicon nitride liner remains intact protecting the P-N junction at the edge of trench region. Subsequent processing of conductive tungsten metal plugs are prevented from shorting by the passivating trench liner. This method of forming borderless contacts with a passivating trench liner in a partially recessed trench isolation scheme improves device reliability since it prevents electrically short circuiting of the P-N junction and lowers the overall diode leakage. In addition, the use of this invention's semi-recessed STI process scheme helps to reduce the aspect ratio of the trench, thereby aiding the filling of the trench. Therefore, with the process described herein, STI oxide seam formation is eliminated.

17 Claims, 3 Drawing Sheets

US 6,265,302 B1

PARTIALLY RECESSED SHALLOW TRENCH ISOLATION METHOD FOR FABRICATING BORDERLESS CONTACTS

RELATED PATENT APPLICATION

This application is related to Ser. No. 09/351,240 with filing date Jul. 12, 1999, assigned to a common assignee.

BACKGROUND OF THE INVENTION (1) Field of The Invention

It is a general object of the present invention to provide a new and improved method of forming an integrated circuit utilizing a partially recessed shallow trench isolation (STI) scheme, in conjunction with a passivating silicon nitride trench liner, to fabricate borderless contacts.

In sub-micron technology shallow trench isolation (STI) has become a standard means of isolation for semiconductor devices and has replaced other isolation methods, i.e., LOCOS (Localized Oxidation of Silicon) which require more valuable area. In the conventional shallow trench isolation process, trenches are formed in a semiconductor substrate between electrically active areas, i.e., MOSFET gates and source/drains, and electrically isolate MOSFET's from each other. The trenches are filled with an insulating material, such as silicon oxide, to provide electrical insulation. Active devices, including MOSFET's, transistors and resistors are fabricated into the semiconductor substrate in the "active" regions with shallow trench isolation (STI), isolating the regions in between the active devices.

As transistor dimensions approached sub-micron, the conventional contact structures in use started to limit the device performance in several ways. First, it is difficult to minimize the contact resistance if the contact hole is also of minimum size and problems with cleaning small contact holes become a concern. In addition, with defined conventional contacts, the area of the source/drain regions cannot be minimized because the contact hole has be aligned to these regions with a separate masking step, and a large "extra" area has to be allocated for possible misalignment. Furthermore, this larger "extra" area also results in increased source/drain-to-substrate junction capacitance, which impacts device speed. Borderless contacts or "unframed" contacts solve many of the micron and sub-micron MOSFET contact problems, easing both the device ground rule designs and easing the processing problems associated with conventional "framed" contacts. The borderless contact makes better use of the space and area over the source/drain region, as will be described in more detail. Borderless contacts are part of the advanced designs and processing associated with shallow trench isolation (STI).

(2) Description of Related Art

With conventional shallow trench isolation (STI) processes, it is a problem to form a borderless contact over the trench region. The borderless contact or "unframed" contact is a contact which overlies and exposes both the active and isolation regions of the semiconductor substrate, usually for the purpose of making contact to a diffusion region formed in the substrate. One problem of forming borderless contacts in combination with conventional shallow trench isolation (STI) involves the etching of the contact hole opening through interlevel layers of dielectrics, while at the same time, trying to avoid etching the dielectric material in trench. Oftentimes, the dielectrics are types of silicon oxide, both for the interlevel and trench fill material. Therefore, the trench filled oxide can be etched and damaged due to the contact hole etch. If the trench isolation material is etched back along the wall of the trench, deleterious effects can occur, i.e., leakage and shorting at the edge of the P/N junction, especially when this region becomes filled with a conducting material.

U.S. Pat. No. 5,807,784 entitled "Device Isolation Methods for a Semiconductor Device" granted Sep. 15, 1998 to Kim describes a method of forming a device isolation layer in semiconductor device comprising of a two step method of forming field oxide in shallow trench isolation (STI). The first step consists of implanting oxygen ions into the bottom of trench in the field region of a semiconductor substrate, and oxidizing the oxygen implanted region to form a field oxide layer. The second step consists of depositing insulation material to further fill the trench.

U.S. Pat. No. 5,807,490 entitled "METHOD OF FILLING SHALLOW TRENCHES" granted Sep. 8, 1998 to Fiegl et al shows a method of isolation in silicon integrated circuit processing which overfills the trench by a fill margin and then deposits a temporary layer of polysilicon having a thickness less than the trench depth. A oxide layer is used as a polishing stop. The temporary layer is polished outside the trench, using a fill layer and polishing stop layer as polishing stops for chemical mechanical polish (CMP). The polishing stop layer is removed by CMP, together with the same thickness of fill layer and temporary polysilicon layer, resulting in surface planarity. The remaining temporary layer is stripped and a final touch up polish of the fill layer stops on the pad nitride.

U.S. Pat. No. 5,817,568 entitled "Method of Forming a Trench Isolation Region" granted Oct. 6, 1998 to Chao describes a method, using multi-trench formation techniques, to define the respective depths of trenches having different widths. The method includes forming a buffer oxide layer and polishing stop layer, in sequence, above a semiconductor substrate. Then, the buffer oxide layer, the polishing stop layer and the semiconductor substrate are defined to form at least one narrow trench. Thereafter, the buffer oxide layer, the polishing stop layer and the semiconductor substrate are again defined to form at least one wide trench. Next, a portion of the oxide layer and a portion of the polishing stop layer are removed to form a planarized surface. Finally, the polishing stop layer and the buffer oxide layer are removed.

U.S. Pat. No. 5,652,176 entitled "Method for Providing Trench Isolation and Borderless Contact" granted Jul. 29, 1997 to Maniar et al describes a method of trench isolation which uses a trench liner comprised of aluminum nitride. Another similar patent is U.S. Pat. No. 5,677,231 entitled "Method for Providing Trench Isolation" granted Oct. 14, 1997 to Maniar et al also shows shallow trench isolation (STI) and a borderless contact process with an aluminum nitride liner under the STI silicon oxide. During the formation of the contact opening, using etch chemistry which is selective to aluminum nitride, the trench liner protects a P-N junction at the corner of the trench. By protecting the junction, subsequent formation of a conductive plug will not electrically short circuit the junction, and keeps diode leakage low.

U.S. Pat. No. 5,268,330 entitled "Process for Improving Shee Resistance of an Integrated Circuit Device Gate" granted Dec. 7, 1993 to Givens et al describes a process involving shallow trench isolation (STI) and contact above P-N junctions that can be made to be borderless contacts. A passivating layer is deposited over an integrated circuit device, fabricated using silicidation. An insulating layer is deposited. The insulating layer is planarized and further polished to expose the passivating layer above the gate. The portion of passivating layer above the gate is removed. A trench above the junctions is formed by removing insulation and using the passivating layer as an etch stop. Then a portion of the passivating layer is removed above the junction. The gate can be further silicided and opening above the gate and trench can be filled. The contacts above the junction can be borderless contacts.

The present invention is directed to a novel method of using CMP to selectively remove a second material over a first material and produce a planar first material surface, free of second material residue. The method of the present invention requires less CMP processing time, has lower cost than conventional CMP methods and produces a polished surface having superior planarity.

SUMMARY OF THE INVENTION

It is a general object of the present invention to provide a new and improved method of forming an integrated circuit utilizing a partially recessed shallow trench isolation (STI) scheme, in conjunction with a passivating silicon nitride trench liner, to fabricate borderless contacts.

A more specific object of the present invention is to provide an improved method of forming borderless contacts in the fabrication of integrated circuits on semiconductor substrates, which are typically single crystal silicon. The initial process involves a pad oxide layer, which is formed by thermally growing a silicon dioxide layer. A "hard mask" layer of silicon nitride is then deposited. A shallow trench for shallow trench isolation (STI) is patterned, as well as, the layers of hard mask nitride and pad oxide, all using a reverse mask process. A shallow trench is etched followed by the deposition of a thick layer of silicon oxide. The thick oxide layer forms a slight dip in the surface over the trench caused by the trench filling process. The surface is planarized, polishing the thick oxide layer back by chemical mechanical polish (CMP), so as to be nearly planar with the hard mask nitride layer. The hard mask nitride layer acts as a polishing stop.

In a first embodiment of the present invention, the above and other objectives are realized by using a method of fabricating a partially recessed shallow trench isolation (STI) structure, as described by the following method. After the planarization of the trench described above, a partial silicon oxide etch back is initiated by using either a dry etch process, or a wet etch process. The end result of the partial etch back step is to etch the oxide in the trench back to approximately halfway to three-quarters of the way down into the trench. More details for the partial etch back process of this present invention can be found in the "DESCRIPTION OF THE PREFERRED EMBODIMENTS" section.

In a second embodiment of the present invention, the above and other objectives are realized by using a method of fabricating a borderless contact, which consists of silicon nitride protection layer within a partially recessed trench. This passivating nitride liner is accomplished in this invention by the following method. After the partial etch back of the trench oxide mentioned above, only a partially recessed oxide remains in the shallow trench. At this step in the process, a key process step in this invention is the formation of a silicon nitride liner in the trench and on top the hard mask nitride. The nitride liner is formed by low pressure chemical vapor deposition (LPCVD) using a combination of ammonia and silane gases. A possible densification step prior to the nitride liner can be high temperature treatment in gas ambient of nitrous oxide, or in oxygen and nitrogen gases. Note that the trench liner, consisting of a silicon nitride layer, fills the trench area, but the trench is already partially filled with oxide below the nitride layer.

After the nitride liner is formed, a thick layer of silicon oxide is deposited by a high density plasma (HDP) system and is performed, in such a manner, as to form a seamless STI trench fill. Another advantage of this process, is that the nitride layer protects the silicon semiconductor from possible radiation damage cause by the high density plasma deposition process.

After the thick high density plasma (HDP) oxide is deposited, the surface is planarized by chemical mechanical polish (CMP) and the polish back stops on the nitride layers, which consists of the thin liner and hard mask layer.

Following the surface planarization by chemical mechanical polish, the nitride layers are removed by etching, except for the nitride liner which remains in the trench, from the etch back by oxide. The shallow trench (STI) oxide, deposited from the high density plasma (HDP) etch, remains filling the top portion of the trench, over the nitride liner. The nitride liner remains in the trench approximately halfway up the trench. The original partially recessed oxide remains under the nitride liner in the bottom portion of the trench.

In a third embodiment of the present invention, the above and other objectives are realized by using a method of fabricating a borderless or "unframed" contact to substrate diffusion regions by taking advantage of the nitride liner, which is self-aligned and acts a protective passivating layer. Utilizing the nitride liner in a partially recessed oxide, this method of contact hole formation and alignment has several advantages that will be described. The key point is that the silicon nitride liner is self-aligned and acts as a protective passivation layer in the region of the diffusions and the edge of the shallow trench isolation. One key advantage to the nitride liners is it forms a borderless contact without reducing the polysilicon to polysilicon spacing, a key design advantage. In addition, the nitride liner protects the shallow trench isolation edge, near the edge of the junction, from both contact hole misalignment and also from the salicide formation process. The nitride liner electrically insulates the trench isolation edges and minimizes field edge intensive electrical leakage. As was mentioned earlier, the nitride liner also protects the silicon semiconductor from radiation damage caused by the earlier high density plasma processes.

Another object of the present invention is to provide an improved method of forming trench fill. The partially recessed oxide, in the multi-step STI oxide fill process described earlier, helps to fill trenches with high aspect ratios and helps to eliminate the STI oxide seams and voids.

Convention processing steps that are employed in this invention to fabricate devices are stated as follows. Prior to the tungsten contact or plug/stud formation , several standard processes are performed: (a) polysilicon deposition, doping, anneal and patterning to form ploy gates (not shown in FIGS.), (b) titanium silicide formation processes, (c) USG undoped silicate glass formation processes, (d) SACVD BPSG, sub-atmospheric chemical vapor deposition of boro phosphosilicate glass formation processes, (e) PE TEOS plasma enhanced TEOS tetraethylortho silicate deposited oxide (not shown in FIGS.) for planarization of the surface. Included are all the standard processes associated with providing these layers, which form an interlevel dielectric layer (ILD). Contact holes are defined and etched followed by CVD tungsten depositing. Tungsten plug/stud formation results, and misalignment of the contact holes is taken care of by the nitride liner in this invention, which is both protective and passivating.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The main embodiment of this invention is a new and improved method of using a partially recessed shallow trench isolation (STI) in a unique process scheme to fabricate borderless contacts.

Figure 1:
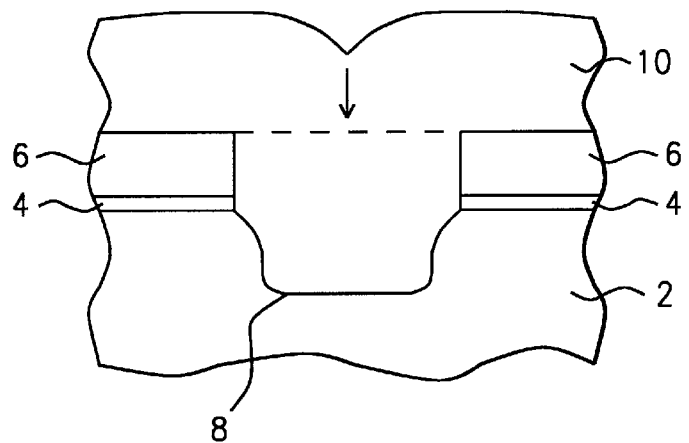
FIG. 1, which in cross-sectional representation illustrates the method of shallow trench isolation (STI) with hard mask, pad oxide and thick oxide blanket deposition.

Referring to FIG. 1, a semiconductor substrate 2 is provided, and typically is a single crystal silicon substrate. A pad oxide layer 4 is formed by thermally growing a silicon dioxide layer. A hard mask layer 6 of silicon nitride is deposited. A shallow trench 8 is patterned and the layers of hard mask nitride and pad oxide are patterned, all using a reverse mask process. A shallow trench is etched and then a thick layer of silicon oxide 10 is deposited with a slight dip in the surface caused by the trench filling process.

This thick layer of silicon oxide shown in FIG. 1, is deposited under the following detailed process conditions, by chemical vapor deposition (CVD). The targeted film thickness is from about 5,000 to 10,000 Angstroms. The deposition temperature is in a broad range from about 400 to 800° C. Reactive gases are silane ($SiH_4$), oxygen ($O_2$), ozone ($O_3$), and dichlorosilane ($SiH_2Cl_2$).

Figure 2:
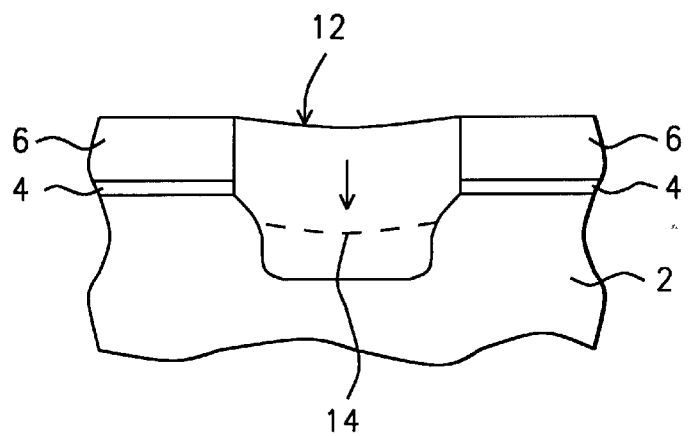
FIG. 2, which in cross-sectional representation illustrates the method of planarization by chemical mechanical polish (CMP) of the surface.

Referring to FIG. 2, the thick oxide layer 12 is polished back by chemical mechanical polish (CMP) and is shown in FIG. 2 to be nearly planar with the hard mask 6 nitride layer, which acts as a polishing stop layer. At this point in the process, a partial silicon oxide etch back step is initiated, using either a dry etch process, or wet etch process. The end result of the partial etch back step is to etch the oxide in the trench back to approximately the dotted line 14, sketched in FIG. 2.

The oxide etch back process shown in FIG. 2 to form a partially recessed trench, is etched under the following detailed process conditions. For the dry etch back process by plasma etching, the chamber pressure is from about 5 to 50 milliTorr, temperature from about 80 to 200° C., power from about 1,000 to 2,000 Watts. The etch rate is from about 3,000 to 6,000 Angstroms/min, with a targeted etch removal from about 5,000 to 10,000 Angstroms. The reactive gases used are: $CF_4$, $CHF_3$, $SiF_4$, $C_4F_8$, Ar, $O_2$. For the wet etch back process, dilute hydrofluoric acid (DHF) is used to removed from about 2,000 to 4,000 Angstroms and the targeted oxide thickness remaining in the trench is from about 1,500 to 2,500 Angstroms.

Figure 3:
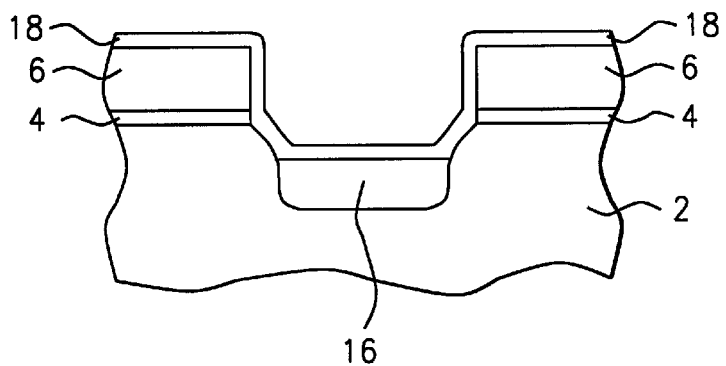
FIG. 3, which in cross-sectional representation illustrates the method of an embodiment of the present invention, whereby a partially recessed trench isolation is formed and a passivating trench liner is fabricated.

Referring to FIG. 3, after the partial etch back, only a partial recess oxide 16 for STI remains. At this stage in the process, a silicon nitride liner 18 is formed in the trench and on top the hard mask nitride 6. The nitride liner 18 can be formed by either low pressure chemical vapor deposition (LPCVD) using a combination of ammonia and silane gases (in a vertical furnace from about 400 to 800° C.), or by a plasma deposition process. The targeted film thickness is from about 500 to 1,000 Angstroms. A densification step can be used, prior to the nitride liner, using an ambient of nitrous oxide, oxygen and nitrogen gases. In addition, the following gases are also possible candidates: $N_2$, $O_2$, $N_2O$, $NO_2$, NO.

Figure 4:
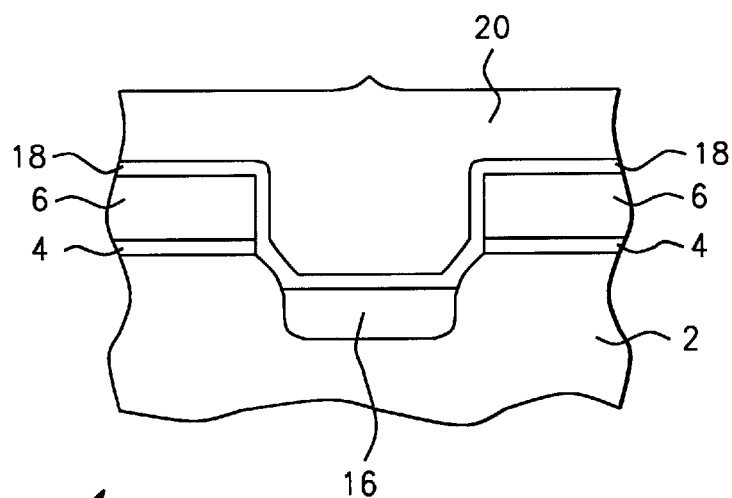
FIG. 4, which in cross-sectional representation illustrates the method of an embodiment of the present invention, whereby a high density plasma (HDP) insulator is blanket deposited for trench fill, without voids and seams.

Referring to FIG. 4, after the nitride liner is formed, a thick layer of silicon oxide 20 is deposited by a high density plasma (HDP) system and is performed, in such a manner, as to form a seamless STI trench fill. Another advantage of this process, is that the nitride layer 18 protects the silicon semiconductor 2 from possible radiation damage from the high density plasma.

The seamless void free process conditions for the high density plasma (HDP) oxide layer, referred to in FIG. 4, are as follows: plasma enhanced chemical vapor deposition (PECVD) reactor, temperature from about 300 to 550° C., reactant gases $SiH_4$, $SiH_2Cl_2$, $O_2$, $O_3$, targeted film thickness from about 1,500 to 3,500 Angstroms.

Figure 5:
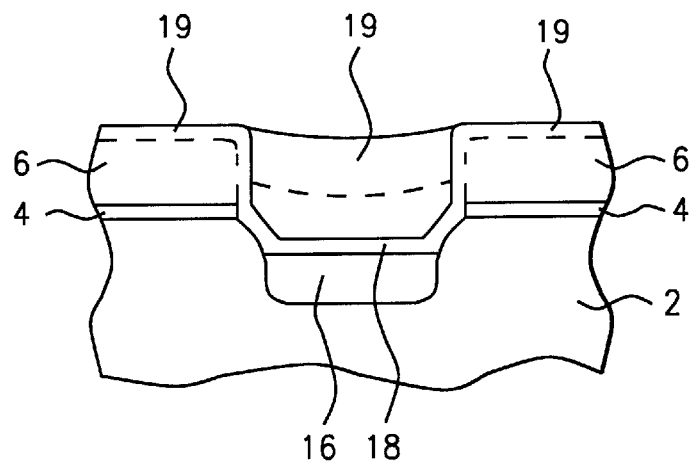
FIG. 5, which in cross-sectional representation illustrates the method of planarization by chemical mechanical polish (CMP) of the surface stopping on the hard mask nitride liner layer.

Referring to FIG. 5, after the thick HDP oxide 20 is deposited, the surface is planarized by chemical mechanical polish (CMP) and the polish back stops within the nitride and oxide layers, sketched by the dotted line 19.

Figure 6:
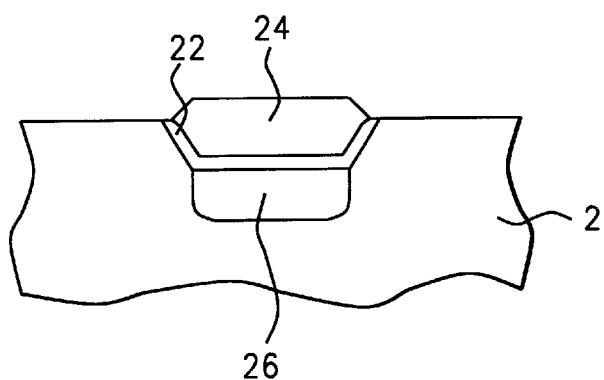
FIG. 6, which in cross-sectional representation illustrates the method of trench isolation formation, whereby the thick hard mask nitride layer is removed.

Referring to FIG. 6, after the surface planarization by chemical mechanical polish, the nitride layers are removed by etching, except for the nitride liner 22 which remains in the trench. The remaining STI oxide 24 is shown filling the top of the trench. The nitride liner 22 is shown approximately halfway up the trench. The partially recessed oxide 26 is sketched in FIG. 6, at the bottom of the trench. The detailed selective, preferential etch conditions to remove just the nitride layer above (not the nitride liner 22) are: (a) selective wet etch process with an aqueous mixture of sulfuric acid $H_2SO_4$, and hydrogen peroxide $H_2O_2$, (b) for removal of entire nitride hard mask, normally from about 1,500 to 2,000 Angstroms nitride removed, (c) amount of oxide removed from about 100 to 300 Ansgtroms. (d) amount of oxide remaining in the trench from about 2,500 to 5,000 Angstroms.

Figure 7:
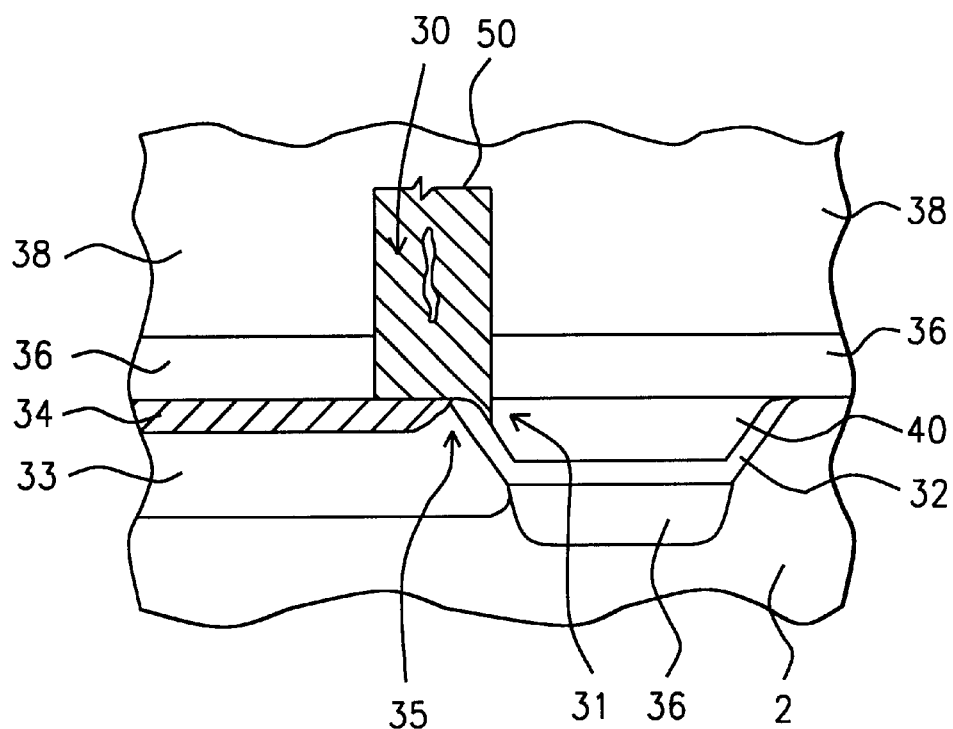
FIG. 7, which in cross-sectional representation illustrates the method of an embodiment of the present invention, whereby an MOSFET device source/drain is electrically contacted using a borderless or "unframed" contact hole with a passivating nitride trench liner.

Referring to FIG. 7, contact hole formation 30 is sketched several advantages of the method are shown. The key point is that the self-aligned passivating silicon nitride liner 32 allows for a borderless contact to the source/drain region 33 without reducing the polysilicon to polysilicon spacing (not shown in FIGS.). Note that the contact hole is misaligned 31 and the edge of the isolation trench is protected by the nitride liner. In addition, the nitride liner 32 protects the field edge junction during the salicide process, overgrowth of silicide protection indicated by arrow 35. The trench isolation region 35 protected by the passivating nitride liner is shown to also provide protection from the titanium silicide process and minimize field-edge intensive junction leakage. As was mentioned earlier, the nitride liner also protects the silicon semiconductor from radiation damage caused by the earlier high density plasma process.

The contact hole formation process, referred above in FIG. 7, uses special processing conditions to selectively etch the oxide and not etch the protecting silicon nitride layer. A plasma dry etching process is utilized that selectively, preferentially removes oxide and stops on the nitride liner (32). The dry etch temperature is from about 80 to 200° C.

Referring to FIG. 7, the partially recessed STI oxide 36 helps to reduce the aspect ratio for the STI oxide fill and helps to eliminate the STI oxide seam and voids. On top of the nitride liner is the STI oxide layer 40.

Again referring to FIG. 7, prior to the tungsten contact or plug/stud formation 30, several standard processes are performed, as outlined in these processing steps: (a) thin gate thermal oxide formation (not shown in FIGS.), (b) polysilicon deposition, doping, anneal and patterning to form poly gates (not shown in FIGS.), (c) poly gate sidewall spacer processes, (d) ion implantation and diffusion processes for source/drain 33 formation (e) titanium silicide 34 formation processes, (f) USG, undoped silicate glass 36 formation processes, depositing this film to about 1,000 Angstroms in thickness, (g) SACVD BPSG, sub-atmospheric chemical vapor deposition of boro phosphosilicate glass 38 formation processes, depositing this film to about 4,000 Angstroms in thickness, (h) PE TEOS plasma enhanced TEOS tetraethylortho silicate deposited oxide (not shown in FIGS.) for planarization of the surface. Included are all the standard processes associated with providing these layers, which form an interlevel dielectric layer (ILD). Contact holes are defined and etched followed by CVD tungsten depositing. Tungsten plug/stud 50 formation results, in the contact hole 30, sketched and outlined in FIG. 7.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a partially recessed shallow trench isolation structure on a semiconductor substrate, in preparation for a passivating trench liner, the method comprising the following steps:

providing a semiconductor substrate, the semiconductor having a trench formed therein;

providing a pad oxide layer patterned on the surface of the semiconductor;

providing a hard mask layer patterned on the surface of the semiconductor;

filling the trench with a thick layer of insulator;

planarizing the insulator back to achieve a trench isolation region which is nearly planar with the hard mask layer;

etching the trench insulator back to approximately half-way to three-quarters of the way down into the trench;

thus forming a partially recessed shallow trench isolation structure on a semiconductor, in preparation for a passivating trench liner.

2. The method of claim 1, wherein the pad oxide is thermally grown silicon dioxide of between 100 to 300 Angstroms in thickness.

3. The method of claim 1, wherein the hard mask layer, which is a stopping layer for chemical mechanical polish (CMP), is silicon nitride of between 1,000 to 3,000 Angstroms in thickness.

4. The method of claim 1, wherein the step of filling the trench comprises a deposition of a thick layer of insulator, which is tetra-ethyl-ortho silicate (TEOS) to form silicon oxide in a thickness from 5,000 to 10,000 Angstroms.

5. The method of claim 1, wherein the step of planarizing the trench is by chemical mechanical polish (CMP).

6. The method of claim 1, wherein the trench filled with silicon oxide is etched back to form a partially recessed oxide trench by using either dry reactive ion etch (RIE) or a wet etch process, in preparation for a subsequent trench liner.

7. A method of fabricating a partially recessed shallow trench isolation structure on a semiconductor substrate and forming a passivating trench liner, the method comprising the following steps:

providing a semiconductor substrate, the semiconductor having a trench formed therein;

providing a pad oxide layer patterned on the surface of the semiconductor;

providing a hard mask layer patterned on the surface of the semiconductor;

filling the trench with a thick layer of insulator;

planarizing the insulator back to achieve a trench isolation region which is nearly planar with the hard mask layer;

etching the trench insulator back to approximately half-way to three-quarters of the way down into the trench;

depositing a passivating insulating layer in the trench, as a liner covering sidewall and isolation insulator, and on top of the hard mask layer;

filling the remaining portion of the trench with an isolation dielectric material to form an isolation region;

planarizing the isolation dielectric back to achieve a trench isolation region which is nearly planar with the hard mask layer, followed by the removal of the hard mask;

thus a protecting passivation layer is formed, that lines the sidewalls of the trench and is in between said bottom layer of isolation insulator and said top layer of isolation dielectric.

8. The method of claim 7, the step of forming a passivating trench liner comprises the deposition of a layer of silicon nitride to a thickness between 500 to 1,000 Angstroms.

9. The method of claim 7, wherein a high density plasma (HDP) silicon oxide trench fill is employed, forming trench fill without voids or seams, after the passivating trench liner is formed.

10. The method of claim 7, wherein the step of filling the remaining portion of the trench comprises a deposition a thick layer of insulator, which is tetra-ethyl-ortho silicate (TEOS) to form silicon oxide in a thickness from 1,500 to 3,500 Angstroms.

11. The method of claim 7, wherein the step of a final planarization of the trench after the passivating liner and thick HDP oxide, is by chemical mechanical polish (CMP).

12. A method of fabricating a partially recessed shallow trench isolation structure on a semiconductor substrate, wherein a passivating trench liner is utilized to fabricate borderless contacts for MOSFET's, by the method comprising the following steps:

providing a semiconductor substrate, the semiconductor having a trench formed therein;

providing a pad oxide layer patterned on the surface of the semiconductor;

providing a hard mask layer patterned on the surface of the semiconductor;

filling the trench with a thick layer of insulator;

planarizing the insulator back to achieve a trench isolation region which is nearly planar with the hard mask layer;

etching the trench insulator back to approximately halfway to three-quarters of the way down into the trench;

depositing a passivating insulating layer in the trench, as a liner covering sidewall and isolation insulator, and on top of the hard mask layer;

filling the remaining portion of the trench with an isolation dielectric material to form an isolation region;

planarizing the isolation dielectric back to achieve a trench isolation region which is nearly planar with the hard mask layer, followed by the removal of the hard mask;

oxidizing the surface to form gate and capacitor oxide for MOSFET;

depositing, doping and patterning polysilicon gates, providing gate sidewall isolation;

forming diffusion regions for MOSFET source/drains;

depositing and selectively forming salicide layers;

depositing and forming interlevel dielectric insulating layers;

patterning and etching contact holes to the source/drain P-N junction diffusion regions, with the passivating trench liner protecting the corner region of the trench;

thus borderless or unframed contacts are fabricated with the use of said protecting passivation layer in a partially recessed or semi-recessed trench isolation scheme.

13. The method of claim 12, wherein passivating trench liner layer is deposited silicon nitride in a thickness from approximately 500 to 1,000 Angstroms.

14. The method of claim 12, comprising of the step of forming a P-N junction in the semiconductor substrate next to the sidewall of the trench, and wherein the prior step of forming a silicon nitride passivating trench liner, protects the P-N junction from the contact hole etching step.

15. A method of fabricating a partially recessed shallow trench isolation structure on a semiconductor substrate, wherein a passivating trench liner is utilized to fabricate borderless contacts for MOSFET's, by the method comprising the following steps:

providing a semiconductor substrate, single crystal silicon providing a trench formed therein;

providing a pad oxide layer of silicon dioxide patterned on the surface of the semiconductor;

providing a hard mask layer of silicon nitride patterned on the surface of the semiconductor;

filling the trench with a thick layer of silicon dioxide insulator;

planarizing the silicon dioxide back by chemical mechanical polish (CMP) to achieve a trench isolation region which is nearly planar with the silicon nitride hard mask layer;

etching the trench silicon dioxide insulator back to approximately halfway to three-quarters of the way down into the trench;

depositing a passivating layer of silicon nitride in the trench, as a liner coving sidewall and the silicon dioxide insulator, and on top of the hard mask silicon nitride layer;

filling the remaining portion of the trench by high density plasmas deposition of silicon oxide, isolation dielectric material, forming an isolation region;

planarizing the silicon oxide isolation dielectric back by chemical mechanical polish (CMP) to achieve a trench isolation region which is nearly planar with the silicon nitride hard mask layer, followed by the removal of the nitride hard mask;

oxidizing the silicon surface to form thermal silicon dioxide for gate and capacitor insulator for MOSFET;

depositing, doping and patterning polysilicon gates;

providing gate sidewall isolation;

forming diffusion regions for MOSFET source/drains;

depositing and selectively forming salicide layers;

depositing and forming interlevel dielectric insulating layers;

patterning and etching contact holes to the source/drain P-N junction diffusion regions;

depositing by chemical vapor deposition (CVD) conductive contact metallurgy into the contact holes;

thus borderless or unframed contacts to source/drain in MOSFET's are fabricated with the use of said silicon nitride passivation liner in a partially recessed or semi-recessed silicon oxide trench isolation scheme, in silicon semiconductor substrate.

16. The method of claim 15, wherein the silicon nitride passivating liner layer protects the silicon from radiation damage during subsequent process steps and after processing is complete.

17. The method of claim 15, wherein the process comprising of the formation of the passivating silicon nitride trench liner is compatible with complementary MOS (CMOS) transistors using both p- and n-type MOSFET gate channels.

* * * * *